United States Patent
Jimi (10) Patent No.: US 7,394,270 B2
(45) Date of Patent: Jul. 1, 2008

(54) SEMICONDUCTOR DEVICE, METHOD AND APPARATUS FOR TESTING SAME, AND METHOD FOR MANUFACTURING SEMICONDUCTOR DEVICE

(75) Inventor: Junichi Jimi, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 10 days.

(21) Appl. No.: 11/193,534

(22) Filed: Aug. 1, 2005

(65) Prior Publication Data
US 2006/0043992 A1    Mar. 2, 2006

(30) Foreign Application Priority Data
Aug. 26, 2004    (JP)    ............... 2004-246141

(51) Int. Cl.
*G01R 31/02* (2006.01)
(52) U.S. Cl. .................................... 324/758
(58) Field of Classification Search ........................ None
See application file for complete search history.

(56) References Cited

U.S. PATENT DOCUMENTS

| | | | |
|---|---|---|---|
| 5,386,623 A * | 2/1995 | Okamoto et al. ............... 29/832 |
| 6,022,807 A * | 2/2000 | Lindsey et al. ............... 438/693 |
| 6,727,723 B2 * | 4/2004 | Shimizu et al. ............... 324/765 |
| 2004/0069988 A1 | 4/2004 | Lin ............................. 257/48 |
| 2005/0085009 A1 * | 4/2005 | Yamaguchi et al. ......... 438/106 |
| 2006/0279001 A1 * | 12/2006 | Nishida ...................... 257/784 |

FOREIGN PATENT DOCUMENTS

| JP | 7-147304 | 6/1995 |
|---|---|---|
| JP | 2002-329742 | 11/2002 |

OTHER PUBLICATIONS

Chinese Office Action dated Aug. 10, 2007, with an English translation.

* cited by examiner

*Primary Examiner*—Jermele M Hollington
(74) *Attorney, Agent, or Firm*—McGinn IP Law Group, PLLC (57) ABSTRACT

The semiconductor device according to an aspect of the present invention is a semiconductor device having an electrode pad to be contacted a test probe for performing probe testing, a bonding area mark for defining a bonding area which performs wire boding on the electrode pad, and a probe area mark for defining a probe repair area for repairing or replacing the test probe for the electrode pad.

6 Claims, 5 Drawing Sheets

SEMICONDUCTOR DEVICE, METHOD AND APPARATUS FOR TESTING SAME, AND METHOD FOR MANUFACTURING SEMICONDUCTOR DEVICE

BACKGROUND OF THE INVENTION

1. Field of the Invention

The present invention relates to a semiconductor device comprising an electrode pad for external connection (referred to as "electrode pad" hereinafter), a method and apparatus for testing the semiconductor device, and a method for manufacturing the semiconductor device. Particularly the invention relates to a semiconductor device comprising an electrode pad which contacts a test probe for electrical characteristic testing, a method and apparatus for testing the semiconductor device, and a method for manufacturing the semiconductor device.

2. Description of the Related Art

In a semiconductor device in the form of a chip, which is formed on a semiconductor substrate, electrical characteristic testing is performed by bringing a test probe of an electrical characteristic testing apparatus into contact with an electrode pad provided in the semiconductor device, which is so called "probing", before mounting a semiconductor chip on the semiconductor device, to electrify the semiconductor device through the test probe. In such a semiconductor device, when bringing a test probe into contact with the surface of an electrode pad when performing probing, a contact damage called "probe damage" is generated on the surface of the electrode pad.

Recently, the area of an electrode pad is made small considerably in order to improve the integration degree of a semiconductor device. When performing so-called bonding where an electrode pad having the small area on which the probe damage is generated is connected an external electrode, the contact area between the external electrode and electrode pad decreases since asperities are formed on the surface of the electrode pad due to the probe damage. Therefore, the problem was that reliability of bonding is decreased. Particularly, a problem is generated when connecting an aluminum electrode pad with gold wire by ultrasonic bonding, because this bonding is performed by forming an alloy of aluminum and gold on the surface of the electrode pad, so the bonded surface is decreased due to the probe damage, whereby the bonding strength between the gold wire and electrode pad is decreased.

Japanese Unexamined Patent Application Publication No. 2002-329742 discloses a semiconductor device for solving such problems described above. In this semiconductor, a test pad for testing which abuts on a test probe, and a pad for bonding which is used for bonding are formed.

Further, Japanese Unexamined Patent Application Publication No. 7-147304 discloses a testing method for performing testing on a semiconductor device. With this testing method, probe damage is optically detected to test whether or not the probe damage protrudes from the allowable range. If the probe damage protrudes from the allowable range, an alarm is released, and then proceedings of the testing are stopped.

However, there are the following problems in the conventional testing. For example, in the semiconductor device comprising a pad for testing and a pad for bonding, the area occupied by the electrode pads on the semiconductor chip is large. In this case, the electrode pad is an obstacle to realizing high scale integration of the semiconductor. Particularly, with the recent multifunction of a semiconductor, the number of electrode pads is increasing, so it is difficult to achieve a multifunctional and highly integrated semiconductor device.

In the testing method where the probe damage is optically detected to judge whether or not the probe damage protrudes from the allowable range, sometimes the probe damage is detected by mistake. Also, testing is repeatedly performed using a probe card, the contact location of the probe end with respect to the electrode pad is gradually shifted. Specifically, location accuracy at the time when the probe is brought into contact with the electrode pad formed on the surface of the wafer is decreased due to deterioration of the physical strength of the probe. Furthermore, testing of a semiconductor is usually implemented before scribing a semiconductor wafer around the semiconductor chip. In this case, after testing is executed in the state where the probe is deteriorated, the probe damage is detected in a detection process. In a specific chip on the wafer, if the probe damage of the electrode pad which is detected in the detection process is defective in determination, the entire chips into which the probe contacts become defective in following tests which judge whether or not the probe damage protrudes from the allowable range. Therefore, there occur problems that yield cannot be improved, and that it is difficult to improve productivity.

Hence, It has now been discovered that testing cannot be performed accurately with the conventional testing method of a semiconductor device, whereby it is difficult to improve productivity.

SUMMARY OF THE INVENTION

According to one aspect of the invention, there is provided a semiconductor device, which includes a probe area mark for defining a probe area for contacting a test probe to an electrode pad, wherein the probe area mark is disposed away from the electrode pad. By means of the semiconductor device of the present invention, a probe area (mark) can be recognized reliably, and testing can be conducted accurately.

According to another aspect of the invention, there is provided a semiconductor device, which includes an electrode pad to be contacted a test probe for performing probe testing, a bonding area mark for defining a bonding area which performs wire boding on the electrode pad, and a probe area mark for defining a probe repair area for repairing or replacing the test probe for the electrode pad. By means of the semiconductor device, occurrence of defective products can be prevented, and productivity can be improved.

According to still another aspect of the invention, there is provided a testing method of the semiconductor device, contacting a test probe to an electrode pad provided in a semiconductor device to perform electrical testing on the semiconductor device, which includes recognizing a probe area mark provided away from the electrode pad, and determining the position of the test probe to a probe area which is defined by the probe area mark. By means of the testing method of the present invention, positioning can be performed accurately, and also accurate testing can be conducted.

According to yet another aspect of the invention, there is provided a testing method of a semiconductor device, comprising, which is includes contacting a test probe to an electrode pad provided in a semiconductor device to perform electrical testing on the semiconductor device, determining whether or not probe damage of the test probe provided in the electrode pad is present in a probe repair area, repairing or replacing the test probe when it is determined that the probe damage is present in the probe repair area, determining, for the electrode pad in which determination is made that the probe damage is present in the probe repair area, whether or not the probe damage is present in a bonding area and judging that the semiconductor device, which has the electrode pad in which the determination is made that the probe damage is present in the bonding area, as a defective product. By means of the testing method, a test probe can be repaired or replaced before defective products are produced, thus occurrence of defective products can be minimized.

According to still another aspect of the invention, there is provided a testing apparatus of a semiconductor device, which includes a probe test execution portion which contacts a test probe to an electrode pad provided in the semiconductor device to perform electrical testing of the semiconductor device, a probe repair determination portion which determines whether or not probe damage of the test probe, which is formed on the electrode pad, is present in a probe repair area, and a defective product determination portion which, for an electrode pad in which determination is made that the probe damage is present in the probe repair area, determines whether the semiconductor device is a defective product or not based on whether or not the probe damage is present in a bonding area. By means of the testing apparatus of the present invention, a test probe can be repaired or replaced before defective products are produced, thus occurrence of defective products can be minimized.

According to yet another aspect of the invention, there is provided a method for manufacturing a semiconductor device, which includes contacting a test probe to an electrode pad provided in a semiconductor device to perform electrical testing of the semiconductor device, repairing or replacing the test probe based on whether or not probe damage of the test probe provided in the electrode pad is present in a probe repair area, judging whether the semiconductor device is a non-defective product or defective product based on whether or not the probe damage is present in a bonding area in the electrode pad in which determination is made that the probe damage is present in the probe repair area, and bonding an external electrode to the bonding area of the electrode pad for the semiconductor device which is judged as a non-defective product. By means of the manufacturing method of the present invention, a test probe can be repaired or replaced before defective products are produced, thus productivity can be improved.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The configuration of the semiconductor device related to the present invention is explained hereinafter. The semiconductor device in accordance with one aspect of the present invention has an electrode pad to be contacted a test probe accurately. Further, the semiconductor device has a probe area mark. The probe area mark defines a probe area for contacting a test probe to the electrode pad. Preferably, the probe area mark is disposed away from the electrode pad. The semiconductor device in accordance with another aspect of the present invention has the electrode pad to be contacted a test probe for performing probe testing. Further, the semiconductor device has a bonding area mark and the probe area mark. Preferably, the bonding area mark defines a bonding area which performs boding on the electrode pad. The probe area mark defines a probe repair area for repairing or replacing the test probe for the electrode pad.

Figure 1:
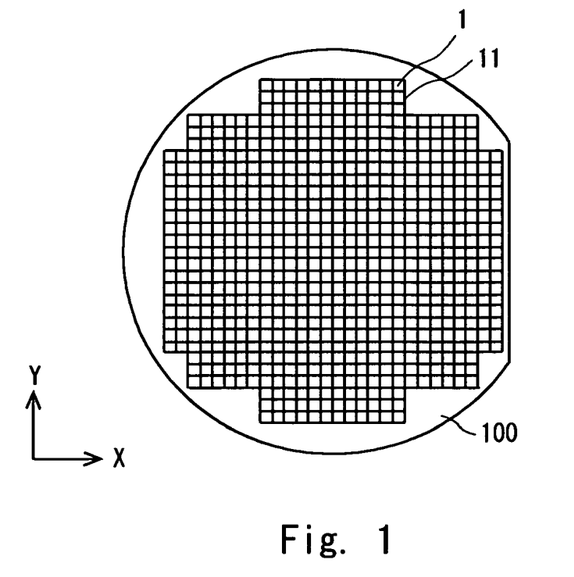
FIG. 1 is a top view schematically showing a configuration of a semiconductor wafer equipped in a semiconductor device according to the present invention.
Figure 2:
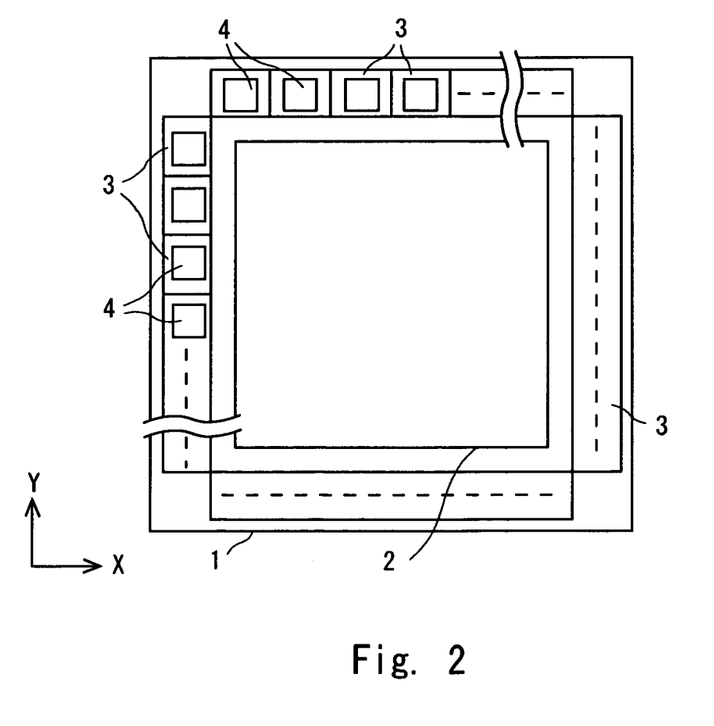
FIG. 2 is a top view schematically showing a configuration of a semiconductor chip which is provided on the semiconductor wafer shown in FIG. 1.

The concrete configuration of the semiconductor device related to the present invention is explained hereinafter. The semiconductor device related to the present invention is now explained using FIG. 1 and FIG. 2. FIG. 1 is a top view schematically showing a configuration of a semiconductor wafer equipped in the semiconductor device according to the present invention. FIG. 2 is a top view schematically showing a configuration of a semiconductor chip which is provided on the semiconductor wafer shown in FIG. 1.

As shown in FIG. 1, a plurality of semiconductor chips 1 are formed on a semiconductor wafer 100. A scribe line 11 for separating the semiconductor chips 1 is provided between each of the semiconductor chips 1. Specifically, when cutting the semiconductor wafer 100 on the scribe line, the semiconductor wafer is divided into the individual semiconductor chips 1. The configuration of thus obtained semiconductor chip 1 is shown in FIG. 2.

As shown in FIG. 2, in the center of the semiconductor chip 1, there is disposed an internal circuit 2, which is constituted by a memory circuit, logic circuit and the like. A plurality of I/O circuit regions 3 are formed on the rims along the circumference of the semiconductor chip 1 so as to surround the inner circuit 2. Specifically, the I/O circuit regions 3 are disposed along the four sides of the vicinity of the outer circumference of the semiconductor chip 1. Electrode pads 4 are respectively disposed in the I/O circuit regions 3. Each of the I/O circuit formed in the I/O circuit regions 3 is electrically connected with each of the electrode pads 4.

Figure 3:
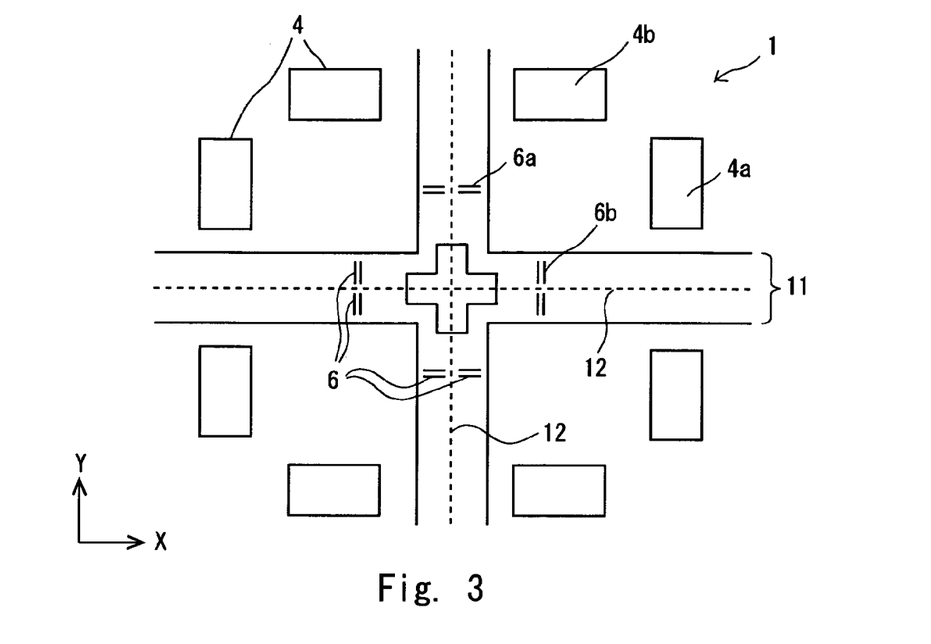
FIG. 3 is a figure showing a configuration before scribing the semiconductor chip according to the present invention.

Next, a configuration around the scribe line 11 on the semiconductor wafer 100 before scribing the semiconductor chip 1 is explained using FIG. 3. FIG. 3 is a top view showing an enlarged configuration of the semiconductor wafer 100 on the periphery of an intersecting point of the scribe lines 11. Here, the X direction and Y direction are the directions in which the scribe lines 11 are provided. Specifically, the semiconductor wafer 100 is scribed in directions parallel to the X direction and Y direction, and divided into the individual semiconductor chips 1.

The semiconductor chips 1 are disposed on both sides of the scribe lines 11 running in the X direction and Y direction. FIG. 3 shows an enlarged configuration of the periphery of each corner of the semiconductor chips 1. Specifically, FIG. 3 shows four semiconductor chips 1, where a configuration of the periphery of each corner, i.e. bottom right, bottom left, top right, and top left, of each of the four semiconductor chips 1 is shown. The electrode pads 4 are formed in the semiconductor chips 1. FIG. 3 shows a region where two electrode pads 4 are disposed in the periphery of the corner of each semiconductor chip 1. Therefore, a total of eight electrode pads are shown in FIG. 3. It should be noted that actually a plurality of electrode pads 4 are arranged vertically and horizontally as shown in FIG. 2. For this reason, in the outer side of the region shown in FIG. 3, a plurality of electrode pads 4a are arranged along the X direction, and a plurality of electrode pads 4b are arranged along the Y direction. In addition, of the plurality of electrode pads 4 disposed in the semiconductor chip 1, the electrode pads 4 shown in FIG. 3 are arranged outermost (on the scribe line side).

The electrode pad 4a and the electrode pad 4b have the same size, and are directed at 90 degrees. The electrode pad 4 is formed to be, for example, 108 µm×60 µm. Therefore, the electrode pad 4a having the size of 108 µm×60 µm in Y direction and X direction is provided, and the electrode pad 4b having the size of 108 µm×60 µm in X direction and Y direction is provided.

Further, the scribe line 11 is provided between the adjacent semiconductor chips 1. The scribe line 11 is approximately 100 µm in width, and is formed parallel to the X direction or Y direction. An area mark 6 is provided on the scribe line 11. The area mark 6 is provided symmetrically with respect to a center line 12 of the scribe line. Here, an area mark 6a for defining a region for the electrode pad 4a and an area mark 6b for defining a region for the electrode pad 4b are provided. Specifically, the area mark 6a corresponds to the electrode pad 4a, and the area mark 6b corresponds to the electrode pad 4b, and they demarcate the region for each electrode pad 4. Furthermore, the area mark 6a defines a region for plurality of electrode pads 4a (not shown in FIG. 3) which are arranged in the X direction, and the area mark 6b defines a region for the plurality of electrode pads 4b (not shown in FIG. 3) which area arranged in the Y direction. It should be noted that the above description explains the top right semiconductor chip 1 in which is shown the configuration of the circumference of the bottom left corner, but the description applies to other semiconductor chips 1.

Figure 4:
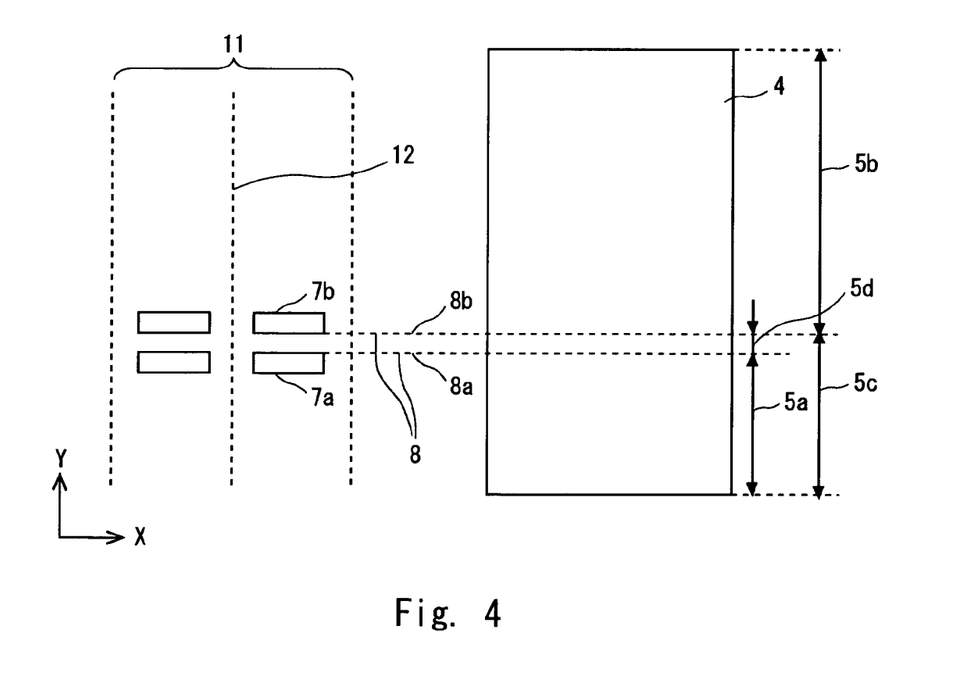
FIG. 4 is a figure showing a configuration of an electrode pad with an area mark in the semiconductor wafer according to the present invention.

Next, a configuration of the electrode pad 4 with the area mark 6 is explained using FIG. 4. The FIG. 4 is an enlarged view which schematically shows the region of the electrode pad 4 which is defined by the area mark 6. A portion corresponding to one of the plurality of electrode pads 4a arranged in the X direction and to the area mark 6a is explained here. The area mark 6a has two marks in order to define three regions in the electrode pad 4. Of the two marks, the lower mark is a bonding area mark 7a, and the upper mark is a probe area mark 7b. The bonding area mark 7a and the probe area mark 7b are disposed in the Y direction with a space of 10 µm. The bonding area mark 7a and the probe area mark 7b have a rectangular shape, and are provided such that each of the sides of the bonding area mark 7a and probe area mark 7b is parallel to either the X or Y direction.

The electrode pad 4 comprises three regions which are defined by the bonding area mark 7a and probe area mark 7b. The first region is a bonding area 5a, which is a region between a virtual line 8a extending from the bonding area mark 7a towards the X direction and a lower end of the electrode pad 4. A gold ball to be connected with an external electrode is formed in the bonding area 5a. The second region is a probe area 5b, which is a region between an upper end of the electrode pad 4 and a virtual line 8b extending from the probe area mark 7b towards the X direction. In this probe area 5b, normally probe testing is carried out. The third region is a probe repair area 5c, which is a region between the lower end of the electrode pad 4 and the virtual line 8b extending from the probe area mark 7b towards the X direction. The bonding area 5a is disposed on the outer circumferential side of the semiconductor chip 1, in other words, on the scribe line side parallel to the X direction. Specifically, the scribe line is disposed in the lower side (−Y direction) of the electrode pad 4 in the X direction. In the electrode pad 4, the bonding area 5a and probe repair area 5c are disposed on the scribe line side of the semiconductor chip 1, and the probe area 5b is disposed on the internal circuit side of the semiconductor chip 1. Further, in order to clarify the explanation, the region obtained by removing the bonding area 5a from the probe repair area 5c, in other words, the region between the virtual line 8a and the virtual line 8b in the electrode pad 4 is a region 5d.

Here, if the electrode pad 4 has the size of 108 µm×60 µm, 34 µm from the lower end of the electrode pad 4 is length of the bonding area 5a. The probe repair area 5c is the region wider than the bonding area 5a by 10 µm in the Y direction. This area corresponds to the width of the region 5d, which is the space between the probe area mark 7b and bonding area mark 7a. Moreover, 64 µm from the upper end of the electrode pad 4 is the probe area 5b. Therefore, the electrode pad 4 is divided into the probe area 5b and the probe repair area 5c, and is configured such that the boding area 5a is contained in the probe repair area 5c. It should be noted that in each area, the width of the X direction is 60 µm, which is equal to the width of the electrode pad 4. The size of the bonding area 5a can be determined in accordance with bonding accuracy of a wire bonding apparatus. Specifically, the size of the bonding area 5a is set such that the bonded wire does not protrude from the bonding area 5a.

Figure 5A:
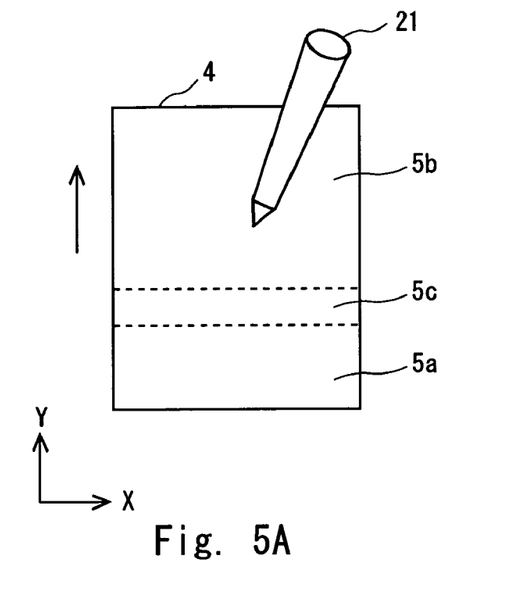
FIG. 5A and FIG. 5B are top views showing a configuration of the electrode pad at the time of testing and of bonding.

The electrical testing method and the manufacturing method of the electrode pad configured as above are now described. First, a test probe 21 of an electrical testing apparatus is moved as shown in FIG. 5A, and is caused to abut against the surface of the electrode pad 4. Testing is performed in a state where an end of the test probe 21 is pressed against the surface of the electrode pad. Accordingly, the electrode pad 4 and the test probe 21 are electrically connected with each other, and the internal circuit 2 of the semiconductor chip 1 is electrified through the test probe 21 and electrode pad 4. It should be noted that testing is carried out before scribing the semiconductor wafer 100 around the semiconductor chip 1, here as shown in FIG. 1.

Figure 5B:
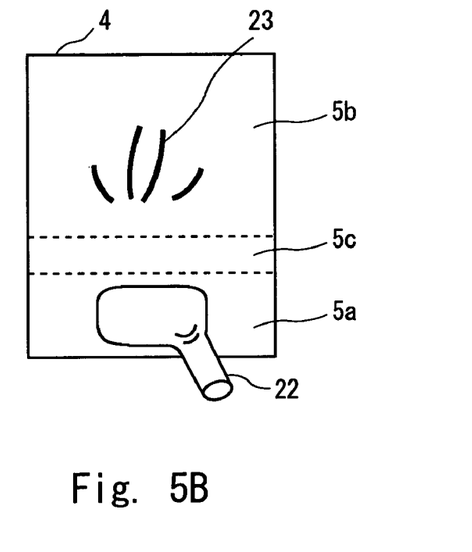

When the test probe 21 is brought into contact with the surface of the electrode pad 4 when performing probing, a contact damage called "probe damage" 23 is generated on the surface of the electrode pad 4 as shown in FIG. 5B. In the region in which the probe damage 23 is formed, when bonding for electrically connecting the external electrode with this region is performed, reliability of bonding is decreased. Specifically, flatness of the surface of the electrode pad 4 is decreased due to the probe damage 23, whereby mechanical connection strength between the gold ball formed on the electrode pad 4 and the electrode pad 4 is decreased.

In order to prevent formation of the gold ball on such probe damage, the probe area mark 7b is optically detected. Then, a position is specified to the probe area 5b which is defined by the probe area mark 7b, and then the end of the test probe 21 is brought into contact with the electrode pad 4. Consequently, the probe damage 23 is confined to the probe area 5b. After the testing is completed, bonding is performed on the bonding area 5a as shown in FIG. 5B. Specifically, in the bonding area 5a which is defined by the bonding area mark 7a, gold wire is bonded to form a gold ball.

However, if the electrical characteristic testing of the numbers of semiconductor chips is repeatedly performed using the same test probe 21 in the mass production line, the location accuracy of the test probe 21 is deteriorated with time. Specifically, even if a position is specified to the probe area 5b, and the test probe 21 is moved, a set distance which is set as a moving distance of the test probe 21 gradually becomes different from the actual moving distance which the test probe 21 has actually moved. As a result, the contact location of the end of the test probe 21 with respect to the electrode pad 4 is gradually shifted. In this case, the probe damage 23 may be formed in such a manner that it protrudes from the probe area 5b. If the probe damage 23 is formed in the bonding area 5a, reliability related to the connection strength between the semiconductor chip and the bonding wire 22 obtained after the bonding process is decreased.

As above, if the location accuracy of the test probe 21 is deteriorated with time, the probe damage 23 is shifted from the probe area 5b to the region 5d, and ends up being formed in the bonding area 5a. If the probe damage 23 is formed in the bonding area 5a, reliability of bonding in the semiconductor chip 1 is decreased.

In the present invention, it is determined whether or not the probe damage 23 is formed in the bonding area 5a. If the probe damage 23 is not present in the bonding area 5a, the semiconductor wafer is judged as a non-defective product. On the other hand, if the probe damage 23 is present in the bonding area 5a, the semiconductor wafer is judged as a defective product. Consequently, it is possible to prevent the defective product from being carried to the subsequent processing, and the productivity can be improved.

Furthermore, in the present invention, in order to prevent occurrence of a defective product in which the probe damage 23 is present in the bonding area 5a, it is determined whether or not the probe damage 23 is present in the probe repair area 5c. If the probe damage 23 is not present in the probe repair area 5c, in other words, if the probe damage 23 is not present in the region from the lower end of the electrode pad 4 to the virtual line 8b, testing is implemented. On the other hand, if the probe damage 23 is present in the probe repair area 5c, a probe card having the test probe 21 is repaired or replaced to keep it in an undegraded state. Specifically, the probe damage 23 is formed in the probe area 5b up until a certain number of semiconductor wafers. If deterioration of the test probe 21 is developed a certain degree or more, the probe damage 23 is formed on the semiconductor wafer, which is tested using the deteriorated test probe 21, in a manner that the probe damage 23 protrudes from the probe area 5b. At this time, the probe damage 23 is formed in the probe repair area 5c which is near the probe area 5b. In other words, the probe damage 23 is formed in the region 5d. Then, if the testing is continued using the same probe card, the contact location of the test probe 21 in the electrode pad 4 is shifted gradually, whereby the probe damage 23 is formed in the bonding area 5a.

Since the probe repair area 5c is set to be larger than the bonding area 5a, the probe damage 23 is formed in the probe repair area 5c before being formed in the bonding area 5a. If it is determined that the probe damage 23 is present in the probe repair area 5c, the probe card is repaired or replaced. It is possible to prevent the probe damage 23 to be formed in the bonding area 5a by repairing the probe card or performing other steps in the stage where the probe damage 23 is formed only in the region 5d. Specifically, the reliability of bonding can be prevented from being decreased. The gold ball is not formed in the region 5d in the bonding step. Therefore, by repairing or replacing the probe card in the stage where the probe damage 23 is present in the region 5d excluding the bonding area 5a from the probe repair area 5c, occurrence of the probe damage in the bonding area 5a can be prevented. The connection strength between the semiconductor chip and the bonding wire obtained after the bonding process is satisfied. Accordingly, occurrence of a defective semiconductor wafer can be prevented, and the productivity can be improved.

As above, if the probe damage 23 is detected in the region 5d excluding the bonding area 5a from the probe repair area 5c, i.e. the region 5d having a width of 10 μm between the virtual line 8a and the virtual line 8b shown in FIG. 4, in the next testing of the semiconductor wafer, formation of the probe damage 23 in the bonding area 5a can be prevented. Accordingly, occurrence of a defective product can be prevented, and the productivity can be improved.

Incidentally, if the test probe 21 is moved on the surface of the electrode pad 4, the probe damage 23 spreads out, whereby a linear probe damage 23 as shown in FIG. 5B is generated. Furthermore, when probing is repeatedly performed, a plurality of the probe damages 23 are generated. In this case, as shown in FIG. 5B, a plurality of the linear probe damages 23 are generated on the surface of the electrode pad 4.

At this moment, the direction in which the test probe 21 slides on the surface of the electrode pad 4 is preferably the direction shown by the arrow (+Y direction) in FIG. 5A. Specifically, in the vicinity of the surface of the electrode pad 4, it is preferred that the test probe 21 is moved in a sliding fashion in the direction so as to be separated from the bonding area 5a. Accordingly, even in the case in which the test probe 21 is moved a distance longer than the moving distance which is set when the movement accuracy of the test probe is deteriorated with time, the probe damage 23 is confined in the probe area 5b.

Each area is then defined separately in a direction vertical to the moving direction on the surface of the electrode pad 4. Specifically, the probe area 5b and the probe repair area 5c are divided by means of the virtual line 8b extending from the bonding area mark 7b to the X direction, and the position of the bonding area 5a within the probe repair area 5c is determined by means of the virtual line 8a extending from the probe area mark 7a to the X direction. The virtual line 8a and the virtual line 8b are made vertical to the moving direction of the test probe 21 on the surface of the electrode pad 4. In other words, the sliding direction of the test probe 21 on the surface of the electrode pad 4 is generally in the Y direction when the virtual line 8a and the virtual line 8b are in the X direction. It should be noted that these directions may not only be a vertical direction but also a tilted direction. Also, the sliding direction of the test probe 21 on the surface of the electrode pad 4 is a direction in which the test probe 21 is separated from the bonding area 5a.

Figure 6A:
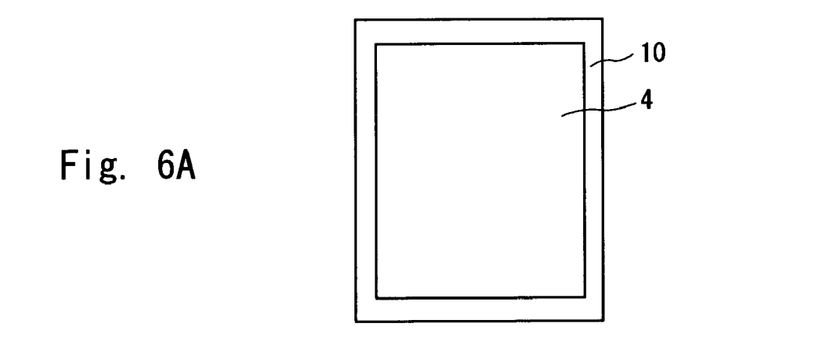
FIG. 6A and FIG. 6B are figures schematically showing a configuration of the electrode pad.
Figure 6B:
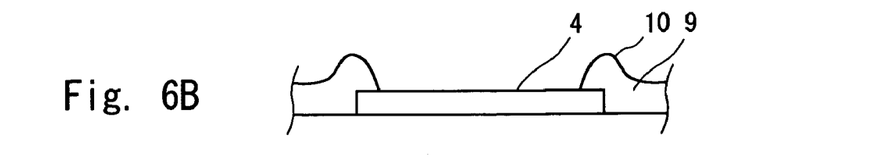

Now, FIG. 6 is used to explain preferred positions for forming the area mark 6. FIG. 6A is a plan view showing a configuration of the electrode pad 4, and FIG. 6B is a cross-sectional view showing a configuration of the electrode pad 4. Normally, the electrode pad 4 is formed of a metal layer such as aluminum, and an insulation film 9 is formed so as to cover the outer periphery of the electrode pad 4. Specifically, an opening portion is provided in the insulation film 9 provided on the aluminum layer to expose the electrode pad 4. Here, the insulation layer 9 is formed from the place in which the electrode pad 4 is not provided through above the electrode pad 4. For this reason, a bump portion 10 is formed in the insulation film 9 on the outer periphery of the electrode pad 4. If the area mark 6 is formed in the vicinity of the outer periphery of the electrode pad 4, the area mark 6 cannot be detected because of the bump portion 10. In other words, even if trying to optically detect the area mark 6, the area mark 6 is hidden behind the bump portion 10, whereby the area mark 6 cannot be recognized. Especially when the insulation film 9 is formed of a resin such as polyimide, the area mark 6 is more likely to be unrecognized. Specifically, since a resin film is usually formed to be thicker than an inorganic film such as SiN, a high bump is created, thus optical detection becomes complicated. Therefore, it is preferred that the area mark 6 be formed away from the electrode pad 4, and this is particularly preferred to a semiconductor device in which a resin film such as polyimide is formed on an upper layer of the electrode pad 4.

The area mark 6 may be provided by patterning the metal layer, which is the uppermost layer same as the electrode pad 4, or by patterning other metal layers. For example, a metal layer same as a wiring layer in the internal circuit 2 of the semiconductor chip can be used. By patterning such metal layer to form the area mark 6, increase of manufacturing processes can be prevented. Moreover, the area mark 6 may be any types of mark as long as it can be optically identified. In order to protect the area mark 6, the entire area mark 6 can be covered with a transparent insulation film such as polyimide. In this case, the area mark 6 is disposed such that the metal pattern is not hidden behind the bump of the insulation film, in order to prevent that the area mark 6 can no longer be detected optically.

The shape of the area mark 6 is not particularly limited. A rectangular metal pattern may be formed, and each area in the electrode pad 4 may be defined by means of the virtual lines 8 extending from the pattern edge of the metal pattern. Of course, as long as the mark can define each area, the shape may be a triangle, trapezoid, or the like. The pattern can be formed with high accuracy in a photolithography process. The area mark 6 is preferably disposed on the scribe line 11. It is because much extra space for forming the area mark 6 exists on the scribe line 11. Moreover, since there is no other wiring layer or insulation film layer formed, optical detection can be performed easily. Further, since scribe line 11 is provided in any type of semiconductor wafer, the area mark 6 can be identified easily regardless of the wiring structure formed in the semiconductor wafer.

Figure 7:
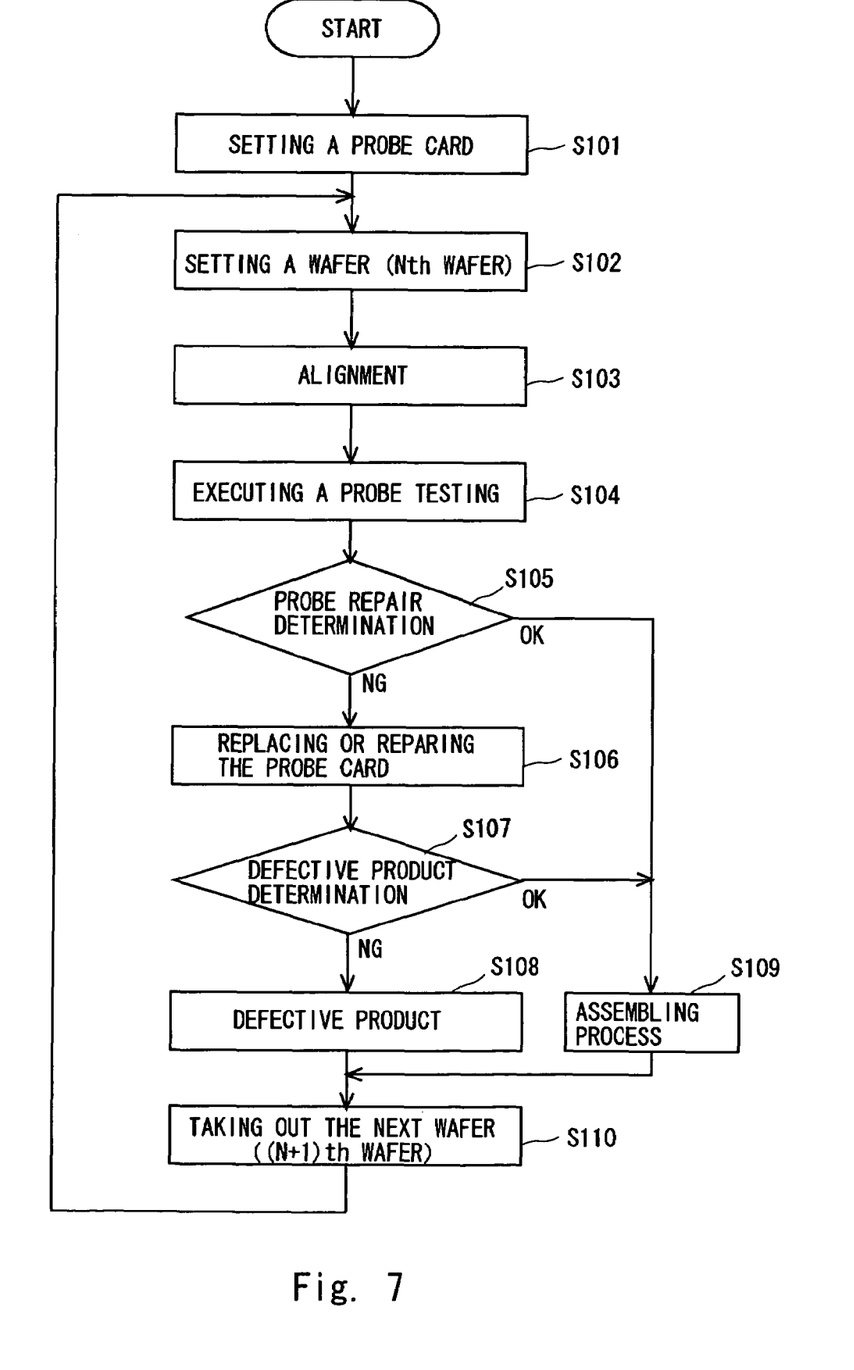
FIG. 7 is a flow chart showing a testing method for a semiconductor according to the present invention.

Next, FIG. 7 is used to explain testing processes for such a semiconductor wafer. FIG. 7 is a flow chart showing a testing process of the semiconductor wafer. First, the probe card is set (step S101). Here, a normal probe card is set. Next, of the plurality of semiconductor wafers stored in a wafer cassette, one semiconductor wafer is taken out to carry out testing, and is set on a stage of the testing apparatus (step S102). Then, alignment of the semiconductor wafer is performed (step S103). Specifically, two scribe lines 11 that run at right angles as shown in FIG. 3 are matched with the X and Y directions on the basis of the orientation flat of the semiconductor. At this moment, the stage of the testing apparatus is activated, for example, to perform alignment.

Thereafter, probe testing is implemented for each semiconductor chip 1 provided on the semiconductor wafer (step S104). Specifically, the end of the test probe 21 is brought to abut against the electrode pad 4 of each semiconductor chip 1, and an electrical signal is outputted form a tester (not shown). An output signal from the semiconductor chip based on the electrical signal is detected to perform assay testing of the electrical characteristic of the semiconductor chip 1. The non-defective/defective product determination of the semiconductor chip is performed by this probe testing. This testing is executed for all the semiconductor chips 1 to be tested that are in the wafer. It should be noted that when testing is carried out, the probe area mark 7b is recognized to bring the test probe 21 to abut against the probe area 5b. Specifically, the probe area 5b defined by the probe area mark 7b is recognized, and the position of the test probe 21 is specified to this probe area 5b. The testing apparatus recognizes probe area mark 7b disposed away from the electrode pad 4 and determines the position of the test probe 21 to the probe area 5b which is defined by the probe area mark 7b. In this position, the test probe 21 is brought into contact with the surface of the electrode pad 4, and probing is performed. The testing apparatus contacts the test probe 21 to the electrode pad 4 provided in the semiconductor device to perform electrical testing on the semiconductor device. Accordingly, the reliability of bonding can be improved.

Next, probe repair determination is performed based on the area in which is present the probe damage 23 of the semiconductor wafer, on which the probe testing is carried out (step S105). Specifically, the probe damage 23 provided in each electrode pad 4 is optically detected. Then, based on the probe area mark 7b, it is determined whether or not the probe damage 23 is present in the probe repair area 5c to judge whether repair or replacement is necessary. The testing apparatus determines whether or not probe damage 23 of the test probe 21 provided in the electrode pad 4 is present in the probe repair area 5c. Here, the probe repair area 5c is the region from the lower end of the electrode pad 4 to the virtual line 8a, as described above. In the case where the probe damage 23 is not present in the probe repair area 5c, the semiconductor chip proceeds to an assembling process (step S109). In the case where the probe damage 23 is present in the probe repair area 5c, the probe card is replaced or repaired (step S106). Consequently, testing is performed on the next and subsequent semiconductor wafers using a normal probe card.

Defective product determination is performed on the electrode pad 4 where the probe damage 23 is present in the probe repair area 5c (step S107). Specifically, based on the bonding area mark 7a, it is determined whether or not the probe damage 23 detected in the step S105 is present in the bonding area 5a. In the case where the probe damage 23 is not present in the bonding area 5a, the semiconductor chip proceeds to the assembling process (step S109). Specifically, the semiconductor chip where the probe damage 23 is not present in the bonding area 5a is not influenced in wire bonding, thus the semiconductor chip is judged as a non-defective product. The wire bonding is performed to bond the electrode pad 4 of the semiconductor chip judged as a non-defective product to the external electrode. On the other hand, in the case where the probe damage 23 is present in the bonding area 5a, the semiconductor chip is judged as a defective product (step S108). The semiconductor chip, which has the electrode pad 4 in which a determination is made that the probe damage 23 is present in the bonding area 5a, judged as a defective product.

It should be noted that the semiconductor chips that are subjected to non-defective/defective product determination in the steps S104 and S108 are applied with different marks respectively and thereby discriminated. Then, the semiconductor chip 1 is cut on the scribe line 11, and thereafter a defective semiconductor chip is discarded. A non-defective semiconductor chip 1 proceeds to the assembling process (step S109), and is subjected to the steps of die bonding, wire bonding, and the like. Furthermore, for the semiconductor chip which is determined as defective in the step S108, the probe damage 23 may also be subjected to testing in detail. In the case where it is judged by the detailed testing that the probe damage 23 does not influence the bonding, the semiconductor chip 1 may be sent to the assembling process (step S109).

After performing testing on one semiconductor wafer 100, the next semiconductor wafer within the wafer cassette is taken out (step S110). Then, testing is carried out through the same processes as described above. Specifically, after testing the Nth semiconductor wafer 100, (N+1)th semiconductor wafer 100 is subjected to testing. After testing the Nth semiconductor wafer, by repairing or replacing the with time deteriorated test probe, occurrence of a defective semiconductor chip 1 at the time of the (N+1)th semiconductor wafer can be prevented. Consequently, the productivity can be improved.

Figure 8:
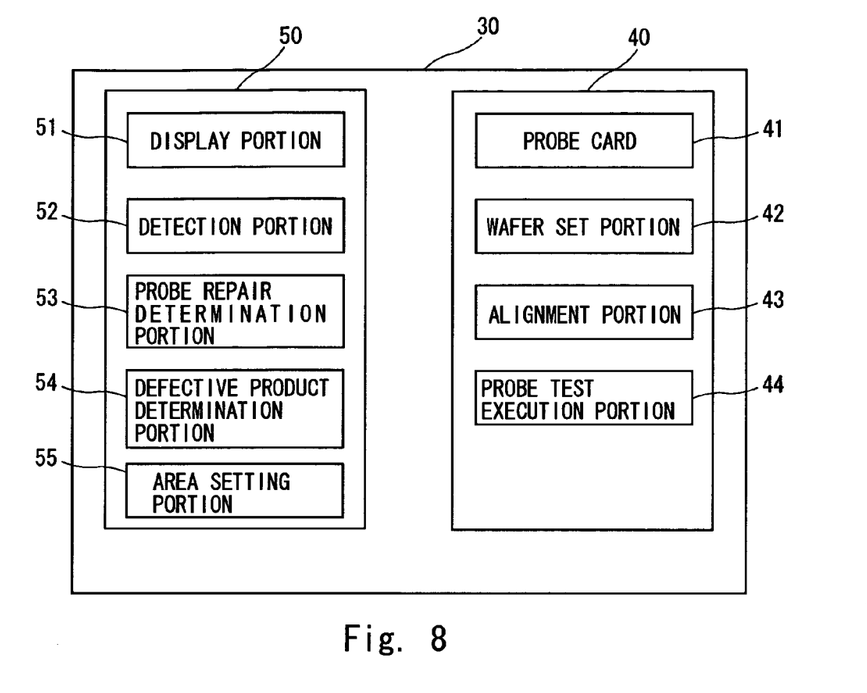
FIG. 8 is a block diagram showing a configuration a testing apparatus of the semiconductor according to the present invention.

Next, FIG. 8 is used to explain a configuration of the testing apparatus which performs probe testing through the above-described processes. FIG. 8 is a block diagram showing a configuration of the testing apparatus. A testing apparatus 30 comprises a probe test unit 40 and a probe damage detection unit 50. The probe test unit 40 comprises a probe card 41, a wafer set portion 42, an alignment portion 43, and a probe test execution portion 44. The probe damage detection unit 50 comprises a display portion 51, a detection portion 52, a probe repair determination portion 53, a defective product determination portion 54, and an area setting portion 55.

The probe card 41 provided in the probe test unit 40 comprises a plurality of probe needles. The plurality of probe needles are attached to the probe card 41 so as to correspond to the arrangement of the electrode pad 4 of the semiconductor chip 1 which is an object of testing. The wafer set portion 42 comprises a stage on which the semiconductor wafer 100 is mounted, and a loader for taking out the semiconductor wafers from the wafer cassette one by one and mounting them on the stage. The wafer set portion 42, for example, takes out one semiconductor wafer from the wafer cassette in which twenty-five semiconductor wafers are stored, and mounts it on the stage. The stage is provided so as to movable in the X or Y direction and rotatable in a θ direction.

The alignment portion 43 performs alignment on the basis of the orientation flat of the semiconductor wafer. For example, an image of an end portion of the orientation flat of the semiconductor wafer is taken by means of a CCD camera which is disposed in a predetermined position. Then, the stage is rotated such that the direction of the orientation flat is in a predetermined direction (X direction or Y direction) in the picture elements of the CCD camera, and then the stage is further moved in the X or Y direction such that the position of the end portion of the orientation flat is in a predetermined position. Accordingly, the semiconductor wafer on the stage can be aligned.

The probe test execution portion 44 executes probe testing on the aligned semiconductor wafer. The probe test execution portion 44 contacts the test probe 21 to the electrode pad 4 provided in the semiconductor chip to perform electrical testing of the semiconductor chip. For example, the probe card 41 provided with the probe needles is moved such that the end of the test probe 21 abuts against the electrode pad 4 which is provided in the semiconductor wafer 100. Specifically, the probe card 41 provided with the probe needles is prepared so as to correspond to the electrode pad 4 on the semiconductor chip provided in the semiconductor wafer 100, and is set in the testing apparatus. The probe card 41 is moved such that the ends of the probe needles abut against the electrode pad 4. An electrical signal for testing is outputted from a tester to the electrode pad 4, and at the same time an output signal from the semiconductor chip 1 is outputted through the probe card 41. Then, the tester performs electrical characteristic testing on the semiconductor chip 1 based on the output signal. At this moment, the sliding direction of the test probe 21 on the surface of the electrode pad 4 is the X or Y direction, or the direction vertical to the virtual lines 8 and a direction in which the test probe 21 separates from the bonding area 5a.

In the semiconductor wafer on which the probe testing is executed, the probe damage 23 is detected by means of the probe damage detection unit 50. The detection portion 52 provided in the probe damage detection unit 50 comprises a light source for reflecting illumination, a light detector such as a CCD camera which detects light from the light source reflected on the semiconductor wafer, and an optical system which transmits light from the light source to the semiconductor wafer and from the semiconductor wafer to the light detector. For example, by scanning the stage on which the semiconductor wafer is mounted, an image of the entire area of the semiconductor wafer is taken. The data obtained by taking an image of the entire area of the semiconductor wafer is then stored as image data in memory. At this moment, it is preferred that the scanning direction be matched with the direction of the scribe line 11. Specifically, the scanning direction of the semiconductor wafer is the X or Y direction.

The detection portion 52 detects the area mark 6 which disposed on the scribe line 11. Specifically, the detection portion 52 stores the shape of a mark as the area mark 6 in advance, and, of the images of the semiconductor wafer, recognizes a mark, which matches the abovementioned mark, as the area mark 6. It should be noted that, for the area mark 6, marks having different shapes may be applied to the probe area mark 7b and the bonding area mark 7a. Accordingly, the probe area mark 7a and the bonding area mark 7b can be recognized reliably.

The area setting portion 55 sets the bonding area 5a, the probe area 5b, and the probe repair area 5c in the electrode pad 4 on the basis of the area mark 6. For example, the area setting portion 55 sets the probe area 5b and the probe repair area 5c by means of the virtual line 8b obtained by extending the pattern edge of the probe area mark 7b in the direction parallel to the scribe line 11. The area setting portion 55 further sets the bonding area 5a by means of the virtual line 8a obtained by extending the pattern edge of the bonding area mark 7a in the direction parallel to the scribe line 11.

Specifically, in the case in which the light emitter of the detection portion 52 is taken as, for example, a two-dimensional array CCD camera, the arrangement of the picture elements of the CCD camera are matched with the X direction and Y direction. In other words, the CCD camera is set such that the picture elements of the CCD camera are arranged in the X direction and Y direction. Then, the stage is scanned in the X direction and Y direction to take an image of the entire area of the semiconductor wafer. Thereafter, the pattern edge of the area mark 6 is detected based on the image of the semiconductor wafer. The lines extending from the pattern edge of this area mark 6 to the X direction or Y direction are the virtual lines 8. Each area is set based on the picture elements of the pattern edge in the image data. Specifically, the pattern edge is detected from the image data of the rendered image, and then the picture elements of the pattern edge are specified. Since the lines extending from the picture elements to the X direction or Y direction are the virtual lines 8, each area is defined by a row of one picture element in the X direction or a row of one picture element in the Y direction including the picture elements.

In addition, the detection portion 52 can detect the electrode pad 4 or the probe damage 23 provided on the electrode pad 4 on the basis of the difference in reflectance. Specifically, since a metal is exposed on the surface of the electrode pad 4, the reflectance on the electrode pad 4 is higher than that on other portion such as an insulation film, Si substrate, or the like. Moreover, since asperities are formed on the surface, the reflectance on the probe damage 23 is lower than that on the surface of the electrode pad 4 where no probe damage 23 is present. Therefore, by detecting reflected light on the surface of the semiconductor wafer 100, the positions of the electrode pad 4 and the probe damage 23 can be specified based on the difference in reflectance. Accordingly, picture elements of the electrode pad 4, the probe damage 23, and area mark 6 are detected.

For example, in the configuration shown in FIG. 4, the picture elements of the pattern edge at the upper side of the bonding area mark 7a are detected. Of the picture elements corresponding to the electrode pad 4, picture elements below the row of detected picture elements in the X direction, which includes the abovementioned picture elements of the pattern edge, is the bonding area 5a. Moreover, the picture elements of the pattern edge on the lower side of the probe area mark 7b are detected. Of the picture elements corresponding to the electrode pad 4, picture elements above the row of detected picture elements in the X direction, which includes the abovementioned picture elements of the pattern edge, is the probe area 5b, picture elements below the row of detected picture elements in the X direction, which includes the abovementioned picture elements of the pattern edge, is the probe repair area 5c. The picture elements of each area can be set easily by performing the above processing. By matching the arrangement of the picture elements with the direction of the scribe line 11, each area can be defined easily.

The display portion 51 comprises a display device such as an LCD or CRT, and can display the rendered image of the semiconductor wafer. Usually, the image of the semiconductor wafer is enlarged and displayed. At this moment, the virtual lines 8 disposed along the X direction or Y direction may be displayed on the screen.

The probe repair determination portion 53 determines whether to repair or replace the probe card 41, based on the probe repair area 5c which is defined as above. The probe repair determination portion 53 determines whether or not the probe damage of the test probe, which is formed on the electrode pad 4, is present in the probe repair area 5c. Specifically, the probe repair determination portion 53 detects the probe damage 23 provided in each electrode pad. In other words, the probe repair determination portion 53 specifies picture elements of the probe damage 23 in the electrode pad 4. Then, the probe repair determination portion 53 determines to repair or replace the probe card 41 based on whether or not the picture elements of the probe damage 23 are contained in the probe repair area 5c. Specifically, when the picture elements of the probe damage 23 are contained in the picture elements of the probe repair area 5c, the probe repair determination portion 53 judges to repair or replace the probe card 41. Accordingly, testing can be performed using a normal probe card 41 from the next and subsequent semiconductor wafers. When the picture elements of the probe damage 23 are not contained in the picture elements of the probe repair area 5c, in other words, when the probe damage 23 is present only in the probe area 5b, the probe repair determination portion 53 judges not to perform repair or replacement of the probe card 41.

The defective product determination portion 54 performs defective product determination based on the bonding area 5a which is defined as above. The defective product determination portion 54 determines, for the electrode pad 4 in which a determination is made that the probe damage is present in the probe repair area, whether the semiconductor chip is the defective product or not based on whether or not the probe damage 23 is present in the bonding area 5a. Specifically, the defective product determination portion 54 performs defective product determination based on whether or not the picture elements detected as the probe damage 23 as above are contained in the bonding area 5a. When the picture elements detected as the probe damage 23 are contained in the picture elements of the bonding area 5a, the semiconductor wafer is judged as defective. When the picture elements of the probe damage are not contained in the picture elements of the boding area 5a, the semiconductor wafer is judged as non-defective. Whether the semiconductor wafer is defective or non-defective is judged in this manner.

It should be noted that defective product determination or probe repair determination can be performed manually. In this case, the display portion 51 is caused to display the virtual lines 8 for defining each area so that the area in which probe damage is present may be visually checked. Accordingly, the determination can be performed easily.

Figure 9:
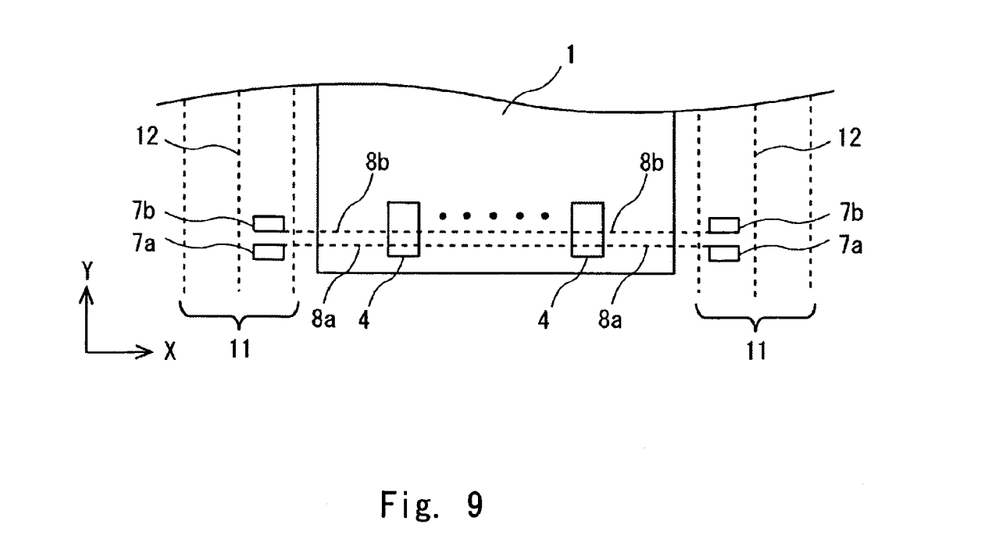
FIG. 9 is a figure showing another configuration of the electrode pad and area mark in the semiconductor wafer according to the present invention.

It should be noted that the area marks may be provided on both ends of the semiconductor chip 1 as shown in FIG. 9 to define the probe area, bonding area, and probe repair area by means of the virtual lines 8a and 8b which connect the above area marks. Here, FIG. 9 shows a configuration of the lower end of the semiconductor chip 1. Specifically, the bonding area marks 7a and probe area marks 7b are provided on both ends of the semiconductor chip 1 on the scribe lines 11. The line connecting the bonding area marks 7a is the virtual line 8a, and the line connecting the probe area marks 7b is the virtual line 8b.

The probe area mark 7b and the bonding area mark 7a may physically the same. In this case, for example, the bonding area 5a may be defined by the virtual line extending from the pattern edge of the area mark 6, and the probe area 5b may be defined by the virtual line extending from the opposite edge. Specifically, in the configuration shown in FIG. 4, the upper end of the area mark is matched with the virtual line 8b, and the lower end of same is matched with the virtual line 8a. Alternatively, either the probe area 5b or bonding area 5a may be defined based on the edge of the area mark, and the other area may be defined based on the picture elements that are separated by a predetermined number of picture elements from the edge. Specifically, the distance equivalent to one picture element may be calculated from the image data. And it is possible to set a row of picture elements having the picture elements that are separated by the distance corresponding to the difference between the probe area 5b and the probe repair area 5c from the edge, as the virtual lines 8.

It is apparent that the present invention is not limited to the above embodiment, that may be modified and changed without departing from the scope and spirit of the invention.

What is claimed is:

1. A semiconductor device comprising:
    an electrode pad to be contacted by a test probe for performing probe testing;
    a bonding area mark for defining a bonding area which performs bonding on the electrode pad; and
    a probe area mark for defining a probe repair area for repairing or replacing the test probe for the electrode pad, wherein the probe repair area of the electrode pad is defined based on a virtual line extending from the probe area mark in a direction parallel to a scribe line, and the bonding area of the electrode pad is defined based on a virtual line extending from the bonding area mark in the direction parallel to the scribe line, and wherein in the electrode pad, probe damage of the test probe is formed in a direction tilted from the virtual line.

2. The semiconductor device according to claim 1, wherein a region from an end portion of the electrode pad on an internal circuit side of the semiconductor chip to the virtual line in the probe area mark is defined as the probe repair area.

3. A semiconductor device comprising:

an electrode pad disposed in an INPUT/OUTPUT region of the semiconductor device; and a probe area mark that defines a probe area for contacting a test probe to the electrode pad, wherein the probe area mark is disposed away from the electrode pad, wherein a probe repair area of the electrode pad is defined based on a virtual line extending from the probe area mark in a direction parallel to a scribe line, and the bonding area of the electrode pad is defined based on a virtual line extending from the bonding area mark in the direction parallel to the scribe line, wherein in the electrode pad, probe damage of the test probe is formed in a direction tilted from the virtual line.

4. The semiconductor device according to claim 3, wherein a region from an end portion of the electrode pad on an internal circuit side of the semiconductor chip to the virtual line in the probe area mark is defined as the probe repair area.

5. A semiconductor device comprising:

an electrode pad; and a probe area mark that defines a probe area for contacting a test probe to the electrode pad, wherein the probe area mark is disposed away from the electrode pad, a probe repair area of the electrode pad is defined based on a virtual line extending from the probe area mark in a direction parallel to a scribe line, a bonding area of the electrode pad is defined based on a virtual line extending from a bonding area mark in the direction parallel to the scribe line, and in the electrode pad, probe damage of the test probe is formed in a direction tilted from the virtual line.

6. The semiconductor device according to claim 5, wherein a region from an end portion of the electrode pad on an internal circuit side of a semiconductor chip to the virtual line in the probe area mark is defined as the probe repair area.

* * * * *